United States Patent [19]

Ueno

[11] Patent Number: 5,444,273
[45] Date of Patent: Aug. 22, 1995

[54] MOSFET CONTROLLED THYRISTOR

[75] Inventor: Katsunori Ueno, Kanagawa, Japan

[73] Assignee: Fuji Electric Co., Ltd., Kanagawa, Japan

[21] Appl. No.: 269,621

[22] Filed: Jul. 1, 1994

Related U.S. Application Data

[60] Continuation of Ser. No. 967,023, Oct. 27, 1992, abandoned, which is a division of Ser. No. 740,896, Aug. 6, 1991, Pat. No. 5,194,927.

[30] Foreign Application Priority Data

Aug. 16, 1990 [JP] Japan .................................. 2-216407
Nov. 30, 1990 [JP] Japan .................................. 2-339249

[51] Int. Cl.$^6$ .................... H01L 29/745; H01L 29/749
[52] U.S. Cl. .................... 257/138; 257/139; 257/371; 257/342; 257/346
[58] Field of Search ............... 257/341, 342, 346, 138, 257/139

[56] References Cited

U.S. PATENT DOCUMENTS 4,502,070  2/1985  Leipold .......................... 257/138
4,857,983  8/1989  Baliga ........................... 257/124

OTHER PUBLICATIONS

B. Jayant Baliga, "The MOS-Gated Emitter Switched Thyristor," Proceedings of 1990 International Symposium on Power Semiconductor Devices & ICs, Toyko pp. 117-121.

B. Jayant Baliga, "The MOS-Gated Emitter Switched Thyristor," TEEE Electron Device Letters, vol. 11, No. 2, Feb. 1990, pp. 75-77.

Primary Examiner—Jerome Jackson
Attorney, Agent, or Firm—Finnegan, Henderson, Farabow, Garrett & Dunner

[57] ABSTRACT

A semiconductor device in which on-operation by a low voltage can be realized, the discontinuity of a current-to-voltage characteristic can be solved, and current concentration in the device configuration is reduced to prevent device break. The semiconductor device comprises: a substrate of a silicon thin plate having a first conductivity type collector region and a second conductivity type base region formed on the first conductivity type collector region; a plurality of wide and narrow gate polysilicon layers selectively laminated with different widths on the substrate through gate insulating films respectively; first conductivity type base regions formed by thermal diffusion by using the wide gate polysilicon layer as a mask; second conductivity type drain and source regions respectively formed so as to be shallower than the first conductivity type base regions by using the plurality of gate polysilicon layers as masks; emitter electrodes provided respectively on the source regions which are farther from the wide polysilicon layer than the corresponding drain regions so as to contact with the first conductivity type base regions respectively so that the source region and the base region are short-circuited; and the second conductivity type base region being electrically connected to the drain and source regions through a plurality of channels formed in the surfaces of the first conductivity type base regions respectively when a gate voltage is applied to the gate polysilicon layers.

1 Claim, 4 Drawing Sheets

MOSFET CONTROLLED THYRISTOR

This application is a continuation of application Ser. No. 07/967,023, filed Oct. 27, 1992, now abandoned, which in turn is a division of application Ser. No. 07/740,896, filed Aug. 6, 1991, now U.S. Pat. No. 5,194,927.

BACKGROUND OF THE INVENTION

The present invention relates to a high-withstand-voltage and large-current semiconductor device, and particularly relates to an improvement of a power semiconductor device in which gate is driven by a voltage and high speed switching operation with realization of a low on-voltage.

As So a device configuration having such a high-withstand-voltage and large-current capacity (hereinafter referred to as "power semiconductor device"), a bipolar transistor, a power MOSFET and so on have been well known. On the other hand, effective use of advantages of these power semiconductor devices is made in, a high-speed and low-on-voltage insulated gate type bipolar transistor (hereinafter abbreviated to "IGBT") which has attracted keen interest, and this IGBT is one type of power semiconductor devices which have been growing rapidly recently.

FIG. 5 shows a sectional structure of an IGBT having a conventional general configuration which is illustrated typically, and FIG. 6 shows an equivalent circuit thereof.

That is, in the sectional structure in FIG. 5 and the equivalent circuit in FIG. 6, this IGBT is constituted by a MOSFET 21 and a PNP transistor 22. The MOSFET 21 is constituted by an n⁻-type base region 5 as a second conductivity type base region, a p-type well 6 as a first conductivity type base region formed on the n⁻-type base region 5, and an n⁺-type source region 8 selectively formed by diffusion in the p-type well 6, and the PNP transistor 22 is constituted by an p⁺-type silicon substrate 7 as a first conductivity type collector region, the n⁻-type base region 5 as the second conductivity type base region, and the p-type well 6 as the first conductivity type base region. The reference numerals 1 to 3 represent an emitter (E), a gate (G) and a collector (C) respectively, 4 represents a gate polysilicon layer (gate electrode) forming the gate 2 through a gate insulating film 10, and 9a and 9b represent metal electrode layers (emitter electrode and collector electrode) forming the emitter 1 and the collector 3 in the same manner. The reference numeral 11 represents an n-type buffer layer.

As is apparent from the equivalent circuit in FIG. 6, a current passed through the MOSFET 21 constituted by the n⁻-type base region 5, the p-type well 6 and the n⁻-type source region 8 in the structure in FIG. 5 becomes a base current of the PNP transistor 22 constituted by the p⁺-type silicon substrate 7, the n⁻-type base region 5 and the p-type well 6, for turning on the PNP transistor 22. That is, in this IGBT, turning-on can be realized not by supplying a current but by applying a voltage to the gate 2. Thus in an IGBT, gate driving can be realized by a voltage, and particularly with respect to its on-voltage, the on-voltage can be set to a comparatively low value unlike the case of a normal power MOSFET, because the IGBT has a characteristic of a bipolar type device represented by the PNP transistor 22.

As an improved configuration obtained by modifying the IGBT having the above-mentioned structure of FIG. 5, a device having a sectional structure shown in FIG. 7 is disclosed in "Proceedings of 1990 International Symposium on Power Semiconductor Device & ICs Tokyo", pp. 117–121. FIG. 8 is an equivalent circuit of the same device.

In the sectional structure of FIG. 7 and the equivalent circuit of FIG. 8, parts which are the same as those of the abovementioned IGBT shown in FIGS. 5 and 6 are referenced with its same reference characters. In addition, the reference numeral 20 represents an n⁺-type drain region selectively formed by diffusion in the p-type well 6 in which an n⁺-type source region 8 is similarly formed. The FIG. 7 structure also includes an NPN transistor 23 and a base short-circuit resistance 24.

The conventional power semiconductor device shown in FIGS. 7 and 8 is different from the above-mentioned general IGBT shown in FIGS. 5 and 6 in that an output current is made to flow by an npnp thyristor of four layers constituted by the n⁺-type drain region 20, the p-type well 6, an n⁻-type base region 5 and a p⁺-type silicon substrate 7, so that it can be considered that the on-voltage is low. The on-voltage can be made substantially lower in the case of the power semiconductor device of FIGS. 7 and 8 than in the case of the IGBT of FIGS. 5 and 6.

However, in the case of the conventional power semiconductor device having the above-mentioned configuration shown in FIGS. 7 and 8, there has been various problems as follow.

That is, as is apparent from the equivalent circuit of FIG. 8, in the thyristor having the above-mentioned configuration, the base-emitter circuit is shorted by the base short-circuit resistance 24, and the thyristor is maintained in its off state normally, so that even if the MOSFET 21 constituted by the n⁺-type drain region 20, the p-type well 6 and the n⁺-type source region 8 is brought into its on state, a current hardly flows while its collector voltage is low because the thyristor is in its off state as mentioned above.

As the collector voltage increases gradually so that a depletion layer is widened in the p-type well 6, the base short-circuit resistance 24 also gradually increases. This is because the base short-circuit resistance 24 is formed of the p-type well 6a and the current path becomes narrow as the depletion layer becomes wide.

Even if the thyristor is in its off state in this state, the value of the current increases little by little by a recombination current in the depletion layer with the increase of the collector voltage, so that a potential drop is caused across the base short-circuit resistance 24 in the p-type well 6. When this potential drop increases sufficiently to make the bipolar type NPN transistor 23 conductive, an amplification factor $a_1$ of the NPN transistor 23 and an amplification factor $a_2$ of the PNP transistor 22 satisfy the relation $a_1+a_2>1$ so that the thyristor goes into its on state.

FIG. 9 shows a current-to-voltage characteristic in the conventional power transistor of FIGS. 7 and 8. In FIG. 9, Vi represents a voltage for the above-mentioned thyristor to reach its on state, that is, a so-called break-over trigger voltage.

As shown in FIG. 9, for the above-mentioned reason, there is a negative resistance region in the thyristor. Accordingly, in the conventional power semiconductor device shown in FIGS. 7 and 8, the thyristor returns to its off state again, even at its conductive time, in such a low current band that the sum of the above-mentioned amplification factors $a_1+a_2$ in the thyristor portion is smaller than 1. Thus, it is very difficult to use the power semiconductor device.

AS has been described, indeed, the thyristor in nature realizes a low on-voltage by positive feedback by current carriers in the two bipolar type transistors 22 and 23, but if the thyristor has substantial voltage discontinuity at its on time as shown in FIG. 9, that is, a negative resistance region, and if the scattering of the voltage vi to reach the on state exists in a chip, on-operation is performed only in a portion where the voltage Vi herein is low, so that current concentration is caused in this corresponding portion.

Indeed such current concentration in the corresponding portion is not an important problem in practice in the case of a small-capacity semiconductor device having a comparatively small chip size, but in the case of a large-capacity power semiconductor device having a large chip size, the effect can easily be so large as to cause device breakdown in the corresponding current-concentration portion.

SUMMARY OF THE INVENTION

The present invention is intended to resolve the foregoing problems in the conventional power semiconductor device, and an object of the invention provide a semiconductor device in which on-operation by a low voltage can be realized, the discontinuity of a current-to-voltage characteristic can be solved, and current concentration in the device configuration is reduced to prevent device break, or to provide a power semiconductor device of such a type.

The semiconductor device according to the present invention comprises: a substrate of a silicon thin plate having a first conductivity type collector region and a second conductivity type base region formed on the first conductivity type collector region; gate polysilicon layers formed on the substrate through gate insulating films respectively and having first and second openings; first and second base regions of first conductivity type respectively formed by thermal diffusion by using the gate polysilicon layers having the first and second openings as masks; drain and source regions of second conductivity type respectively formed so as to be shallower than the first and second base regions of the first conductivity type by using the gate polysilicon layers as masks; and the first and second base regions of the first conductivity type being formed so as not to contact with each other.

In the semiconductor device according to the present invention, therefore, since the second conductivity type drain and source regions formed in high density are electrically connected to each other through a plurality of channels formed in the surfaces of the first conductivity type base regions when a turn-on voltage is applied to the gate polysilicon layers, it is possible to immediately make a base current flow into the thyristor, so that the thyristor easily goes to its on state, and it is therefore possible to obtain a device configuration in which there is no discontinuity in its current-to-voltage characteristic, and current concentration is reduced.

DESCRIPTION OF THE PREFERRED EMBODIMENTS

The semiconductor device according to the present invention will be described with reference to FIGS. 1 and 2, and FIGS. 3 and 4 respectively.

Figure 1:
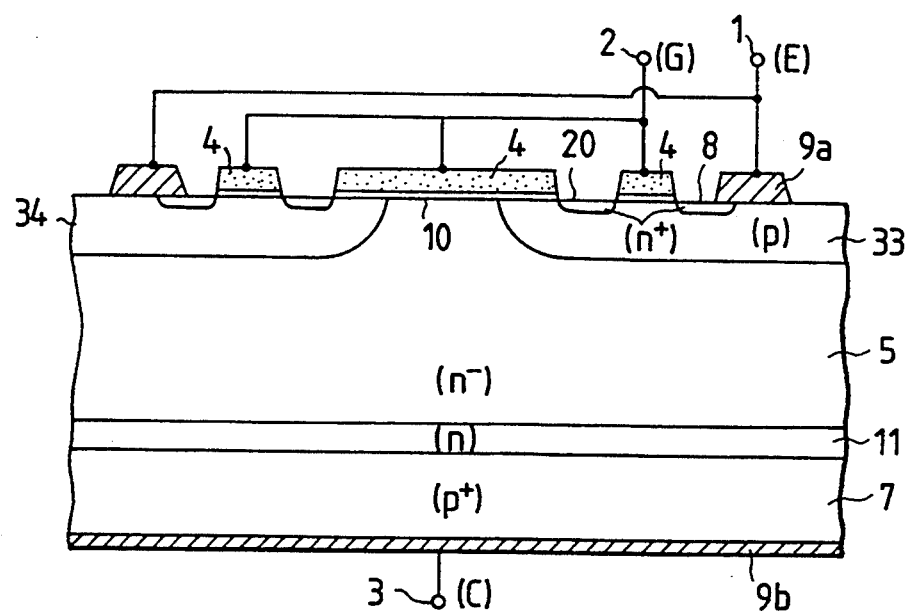
FIGS. 1 and 3 are sectional diagrams respectively illustrating schematic configurations of power semiconductor devices in accordance with first and second embodiments of the present invention.
Figure 2:
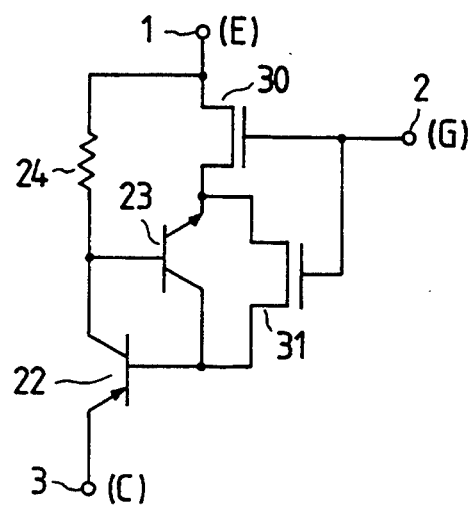
FIGS. 2 and 4 are equivalent circuit diagrams corresponding to the respective power semiconductor devices of the above first and second embodiments.
Figure 3:
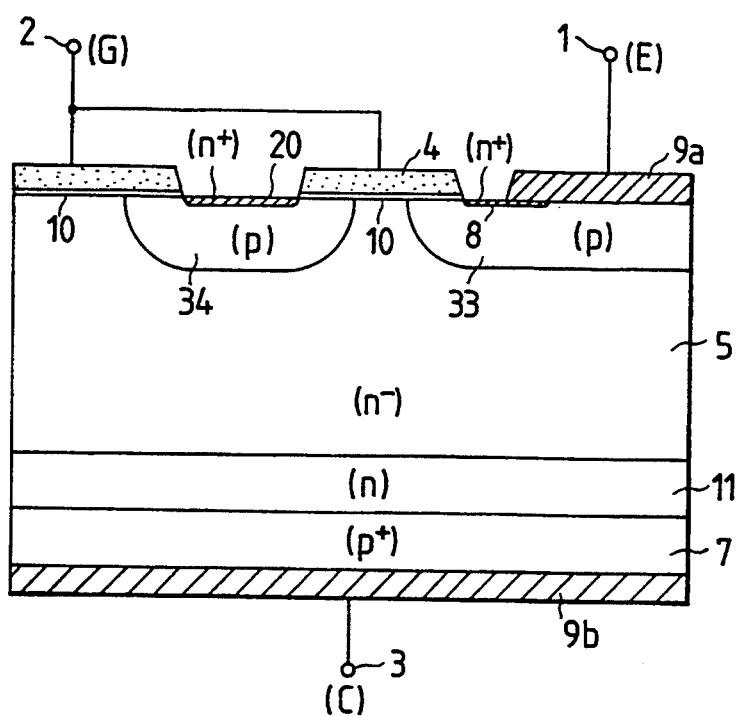
Figure 4:
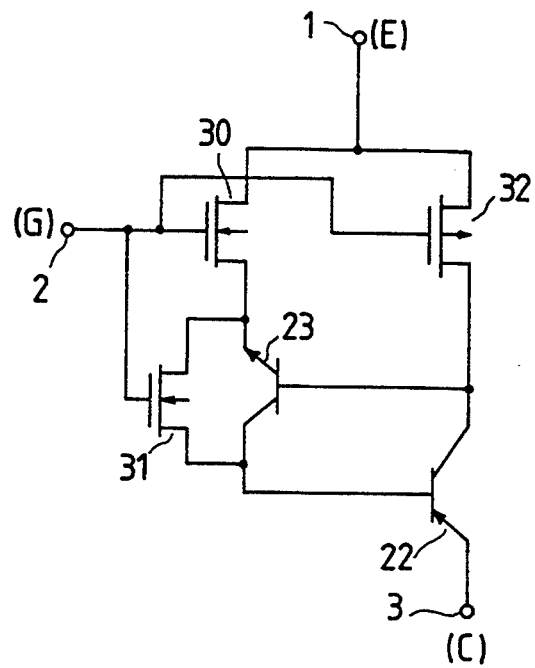
Figure 5:
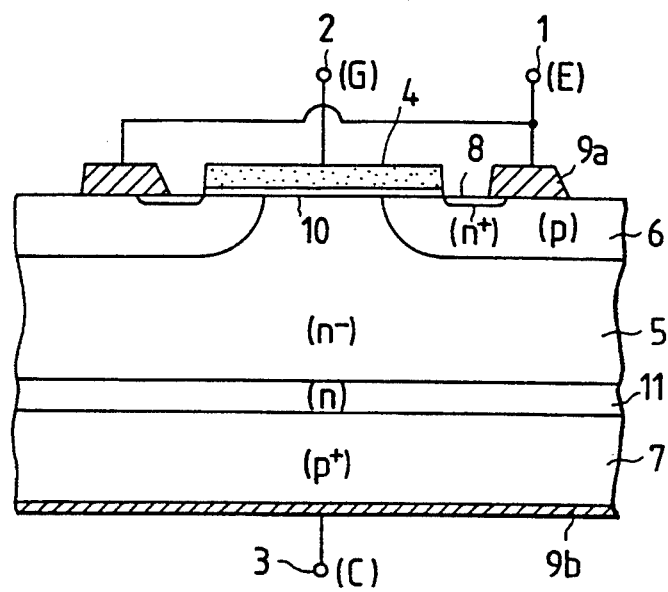
FIG. 5 is a sectional diagram illustrating a typical configuration of a conventional general IGBT.
Figure 6:
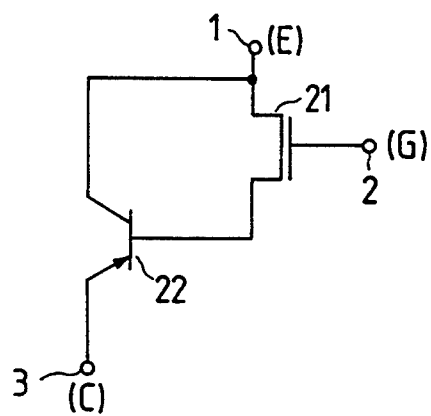
FIG. 6 is an equivalent circuit diagram corresponding to the IGBT shown in FIG. 5.

FIGS. 1 and 3 are sectional views respectively illustrating schematic configurations of power semiconductor devices of first and second embodiments of the present invention, and FIGS. 2 and 4 are equivalent circuits respectively corresponding to the power semiconductor devices according to the first and second embodiments.

In these power semiconductor devices according to the respective first and second embodiments shown in FIGS. 1 and 2, and FIGS. 3 and 4, parts that are simultaneously corresponding parts in conventional devices shown in FIGS. 5 and 6, and FIGS. 7 and 8 are referenced by like reference characters.

In the sectional structures of these devices according to the respective first and second embodiments shown in FIGS. 1 and 3, the reference numeral 33 represents a first p-type base region selectively formed on the above-mentioned $n^-$-type base region 5 independently of the latter, and 34 represents a second p-type base region selectively formed on the $n^-$-type base region 5 independently of the latter in the same manner as and separately from the first p-type base region 33.

In the device configuration according to the first embodiment of FIG. 1, an $n^+$-type drain region 20 and an $n^+$-type source region 8 are selectively shallowly formed in each of the first and second p-type base regions 33 and 34. Gate polysilicon layers 4 are formed through gate insulating films 10 on surfaces between the first and second p-type base regions 33 and 34, between the drain region 20 and the source region 8 on the first p-type base region 33, and between the drain region 20 and the source region 8 on the second p-type base region 34. Emitter electrodes 9a are formed on the respective $n^+$-type source regions 8 so as to short the respective source regions 8 to the p-type base region 33 and 34. In the equivalent circuit of FIG. 2 corresponding to the above first embodiment device, the reference numeral 30 represents a turn-on MOSFET, and 31 represents a trigger MOSFET.

Figure 7:
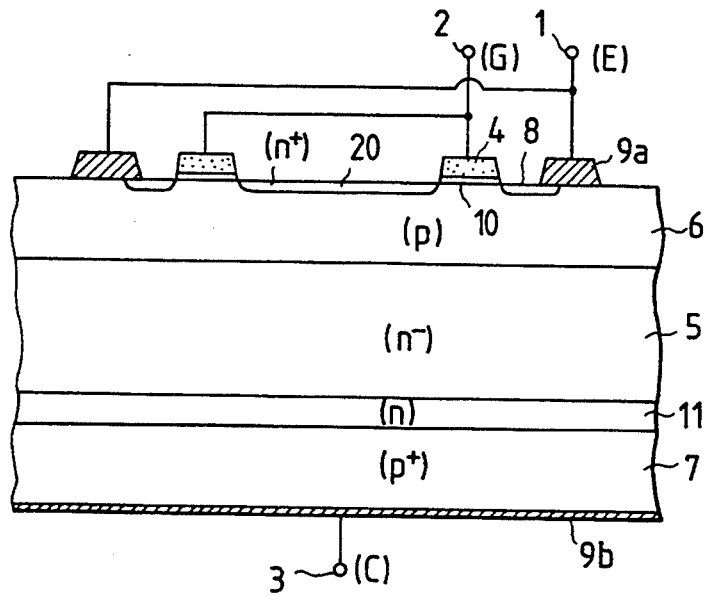
FIG. 7 is a sectional diagram illustrating a typical schematic configuration of a conventional power semiconductor device as a modification of the configuration of FIG. 5.

That is, the configuration of the power semiconductor device according to the first embodiment shown in FIG. 1 is different from the above-mentioned configuration of the power semiconductor device in the conventional example shown in FIG. 7 in that the $n^+$-type drain region 20 and the $n^-$-type base region 5 are connected to each other through a channel produced on the gate polysilicon layer 4 side in the p-type well 6 when an on-voltage is applied to the gate polysilicon layer 4 in the case of this first embodiment, while the n+-type drain region 20 is made to be in an electrically floating state by the p-type well 6 in the case of the conventional device. In this case, the n+-type drain region 20 corresponds to a source of the MOSFET 31 in the equivalent circuit shown in FIG. 2, so that the MOSFETs 30 and 31 are connected in series.

When an on-voltage is applied to a gate 2, therefore, both the MOSFETs 30 and 31 are in their on states, so that a current is passed to a base of a PNP transistor 22 to thereby turn it on, and the main current of the PNP transistor 22 flows in a base short-circuit resistance 24, so that an NPN transistor 23 is turned on as a voltage drop is produced across the resistance 24. As a result, an npnp tyristor of four layers constituted by the n+-type drain region 20, the p-type well 6, the n⁻-type base region 5 and a p+-type silicon substrate 7 is made conductive substantially immediately. That is, all the elements are turned on at the same time as an on-voltage is applied to the gate 2.

Figure 8:
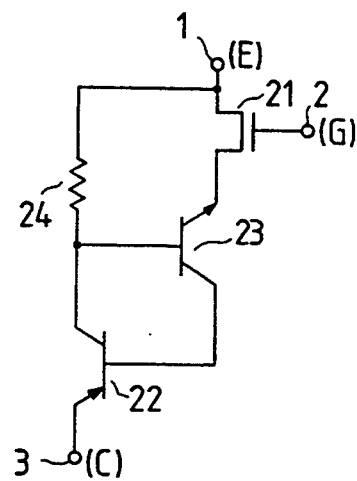
FIG. 8 is an equivalent circuit diagram corresponding to the power semi conductor device shown in FIG. 7.
Figure 9:
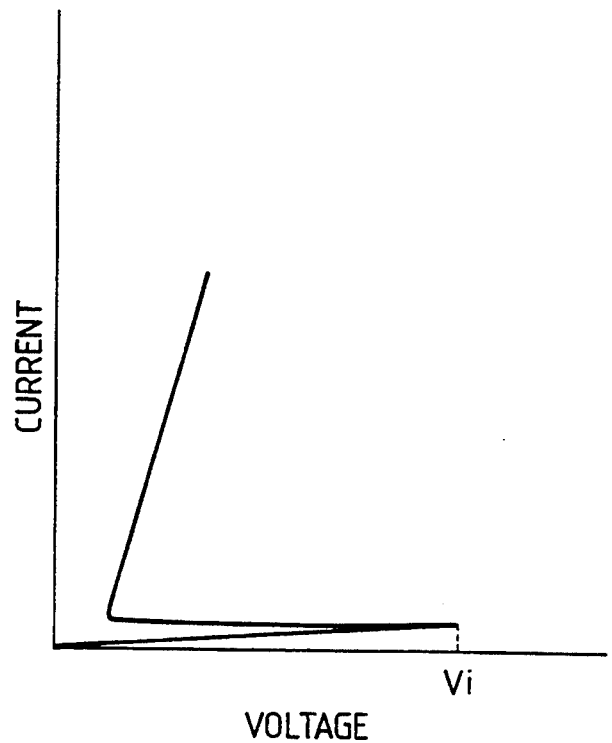
FIG. 9 is a graph illustrating a current-to-voltage characteristic-in the power semiconductor device of FIG. 8.

Consequently, in the power semiconductor device according to the first embodiment shown in FIGS. 1 and 2 herein, there is no production of such discontinuity in a current-to-voltage characteristic as in the convention power semiconductor shown in FIGS. 7 and 8 (with reference to FIG. 9), and this means that little current concentration due to the discontinuity is hardly generated, thereby enabling facilitated production of making a device configuration with a large capacity. On the other hand, a wafer process in this first embodiment configuration is the same as that in an IGBT and has no change.

Next, in the device configuration according to the second embodiment shown in FIG. 3, an n+-type source region 8 is selectively shallowly formed by diffusion in a first p-type base region 33, and an n+-type drain region 20 is formed in the same manner in a second p-type base region 34. A gate polysilicon layer 4 is formed through a gate insulating film 10 on the surface between the n+-type source region 8 and the n+-type drain region 20. In the equivalent circuit shown in FIG. 4 corresponding to the above-mentioned second embodiment device, the reference numeral 31 represents a turn-on n-channel MOSFET formed on the surface portion of the first p-type base region 34, 30 represents a trigger n-channel MOSFET formed on the surface portion of the first p-type base region 33 as well as on the surface portion of the second p-type base region 34 facing the former surface portion, and 32 represents a turn-off p-channel MOSFET formed by use of the first and second p-type base regions 33 and 34 as its source and drain respectively.

Also in the device configuration according to the second embodiment, a base current is supplied to a thyristor constituted by a PNP transistor 22 and an NPN transistor 23 when a predetermined on-voltage is applied to a gate 2 so that the n-channel MOSFETs 30 and 31 are turned on. Further, since the base of this thyristor is insulated from the emitter by the p-channel MOSFET 32, the thyristor goes to its on-state immediately, so that, as in the case of the above-mentioned first embodiment, there is no production of the discontinuity of a current-to-voltage characteristic which is seen in the conventional power semiconductor device, and it is possible to prevent the occurrence of current concentration.

In this case, however, the n-channel MOSFET 31 formed on the surface portion of the first p-type base region 33 supplies electrons to the substrate side through the space between first p-type base region 33 and the second p-type base region 34. In such a case, supplying of electrons through the n+-type drain region 20 thus becomes difficult so that the operation of the thyristor is retained thereby making possible the discontinuity of a current-to-voltage characteristic as mentioned above is produced. In order to prevent this, it is preferred that the interval between the first and second p-type base regions 33 and 34 is made close, i.e., to about several microns, and in the case of forming thus, a depletion layer is widened from the respective p-type base regions 33 and 34 toward the n⁻-type base region 5 to thereby block electrons from going through here to the substrate side. This has been well known in a power MOSFET, as a so-called JFET effect.

In addition, at the off time of this second embodiment device, both the n-channel MOSFETs 30 and 31 are turned off, and the p-channel MOSFET 32 is turned on when a negative bias is applied to the gate 2. Therefore, in the operation of the above-mentioned thyristor, its emitter is turned off by the MOSFET, and a current escapes through the MOSFET 32 to the emitter, thereby realizing an intended high-speed switching operation.

As has been described, according to the present invention, second conductivity type base and drain regions are electrically connected to each other by a plurality of channels formed on a first conductivity type base region to thereby form a by-pass when an on-voltage is applied to a gate polysilicon layer, so that a base current of a thyristor can be immediately supplied to thereby make the thyristor go into its on state easily. It is therefore possible to constitute a semiconductor device with reduced current concentration.

The foregoing description of the preferred embodiment has been presented to illustrate the invention. It is not intended to be exhaustive or to limit the invention to the form disclosed. In applying the invention, modifications and variations can be made by those skilled in the pertaining art without departing from the scope and spirit of the invention. It is intended that the scope of the invention be defined by the claims appended hereto, and their equivalents.

What is claimed is:

1. A semiconductor device comprising:
   a substrate of a silicon thin plate having a first conductivity type collector region and a second conductivity type base region formed on said first conductivity type collector region;
   respective gate polysilicon layers formed on said substrate through respective gate insulating films;
   first and second gate openings respectively disposed adjacent said gate polysilicon layers;
   first and second base regions of first conductivity type respectively formed in the substrate under said first and second gate openings;
   only one second conductivity type region operating as a source formed under said first gate opening so as to be shallower than said first base region; and
   only one second conductivity type region operating as a drain formed under said second gate opening so as to be shallower than said second base region;
   wherein said first and second base regions of the first conductivity type are formed so as not to contact each other, and wherein an upper surface of said second base region is covered in part by the gate insulating films and in remainder by said second conductivity type region operating as a drain free of direct electrode contact.

* * * * *